United States Patent
Szajnowski (10) Patent No.: US 7,145,933 B1
(45) Date of Patent: Dec. 5, 2006

(54) METHOD AND APPARATUS FOR GENERATING RANDOM SIGNALS

(75) Inventor: Wieslaw Jerzy Szajnowski, Surrey (GB)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 1062 days.

(21) Appl. No.: 09/633,275

(22) Filed: Aug. 4, 2000

(30) Foreign Application Priority Data

Aug. 5, 1999 (GB) .................................. 9918518.3

(51) Int. Cl.
*H04B 1/69* (2006.01)

(52) U.S. Cl. ..................................................... 375/130

(58) Field of Classification Search ................ 375/130, 375/139, 135, 13 D, 146, 147, 367; 327/164; 342/131; 708/250, 255

See application file for complete search history.

(56) References Cited

U.S. PATENT DOCUMENTS

| | | | | |
|---|---|---|---|---|
| 3,728,533 A | * | 4/1973 | Matthews | 708/212 |
| 4,429,310 A | * | 1/1984 | Zscheile et al. | 342/135 |
| 4,513,386 A | * | 4/1985 | Glazer | 708/255 |
| 4,617,530 A | | 10/1986 | Young | |
| 4,905,176 A | * | 2/1990 | Schulz | 708/252 |
| 4,928,310 A | | 5/1990 | Goutzoulis et al. | |
| 5,153,532 A | | 10/1992 | Albers et al. | |
| 6,031,485 A | * | 2/2000 | Cellai et al. | 342/131 |
| 6,167,037 A | * | 12/2000 | Higuchi et al. | 370/335 |
| 6,275,959 B1 | * | 8/2001 | Ransijn | 714/705 |
| 6,381,261 B1 | * | 4/2002 | Nagazumi | 375/138 |
| 6,539,320 B1 | * | 3/2003 | Szajnowski et al. | 702/79 |

FOREIGN PATENT DOCUMENTS

| | | |
|---|---|---|
| EP | 0 293 287 A1 | 11/1988 |
| EP | 0 488 739 A1 | 6/1992 |
| WO | WO 9110182 | 7/1991 |
| WO | WO 9833075 | 7/1998 |
| WO | WO 00/54406 A1 | 9/2000 |

OTHER PUBLICATIONS

"Generateurs perfectionnes de signaux electriques" Societe D'Electronique et D'Automatisme, Dec. 15, 1961.
"Alpha-Particle Random No. Generator" IBM Technical Disclosure Bulletin, vol. 30, No. 9, Feb. 1988.

* cited by examiner

*Primary Examiner*—Khanh Tran
*Assistant Examiner*—Sam K. Ahn
(74) *Attorney, Agent, or Firm*—Birch, Stewart, Kolasch & Birch, LLP (57) ABSTRACT

A random binary signal is generated using a plurality of noise sources, each of which defines events occurring at random intervals, the outputs of the sources being combined in such a way that the events are interspersed in the resultant signal.

11 Claims, 12 Drawing Sheets

METHOD AND APPARATUS FOR GENERATING RANDOM SIGNALS

FIELD OF THE INVENTION

This invention relates to a method and apparatus for generating random signals, and particularly but not exclusively random binary waveforms.

BACKGROUND OF THE INVENTION

Random binary waveforms with specific correlation properties are required for ranging and other applications, especially in radar systems. It is particularly desirable to provide random binary waveforms with maximum unpredictability, hence with low probability of intercept, and also resistant to intelligent jamming. Furthermore, such random binary waveforms are also useful for applications in multi-user environments where many similar or disparate systems operate in the same geographical region and those systems share, at least partly, the same wide frequency band.

The generation of binary waveforms with specified correlation properties is of considerable practical interest in the field of radar and communications. For example, in low probability of intercept (LPI) radar the phase of the coherent carrier is modulated by a pseudo-random binary waveform to spread the spectrum of the transmitted signal. In some applications, such as collision avoidance/obstacle detection, altimetry, autonomous navigation etc., many similar radar systems should be capable of operating in the same region and sharing the same wide frequency band. To avoid mutual interference, each system should use a distinct signal, preferably orthogonal to the signals employed by all other systems. Therefore, the successful use of coded-waveform radar in a multi-user environment depends on the availability of large families of waveforms, each with specified correlation properties and low cross correlation values.

An important class of synchronous binary waveforms can be obtained from suitably constructed binary sequences, such as pseudo-random binary sequences. However, when the number and type of systems (co-operating or unco-operating) sharing the same frequency band is unknown and often cannot even be predicted, it is not possible to assign a distinct binary sequence to each of them. It is also difficult to construct large sets of long pseudo-random sequences that provide a significant improvement over purely random sequences.

The above problems can be avoided, or at least alleviated, when asynchronous random binary waveforms are used. In dense signal environments asynchronous waveforms are known to be superior to synchronous ones as a result of the additional randomisation of the zero crossing time instants. Because purely random binary waveforms exhibit maximum unpredictability, they are less vulnerable to intercept and intelligent jamming.

Figure 1:
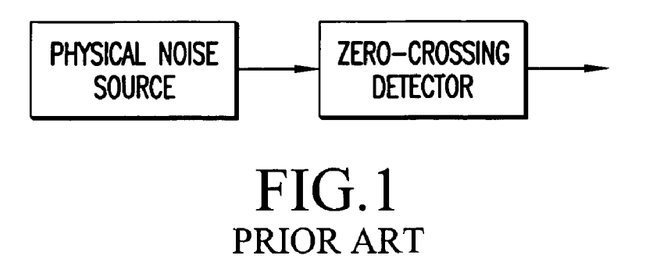
FIG. 1 shows an example of a system for generating a random binary waveform in accordance with the prior art.
Figure 2:
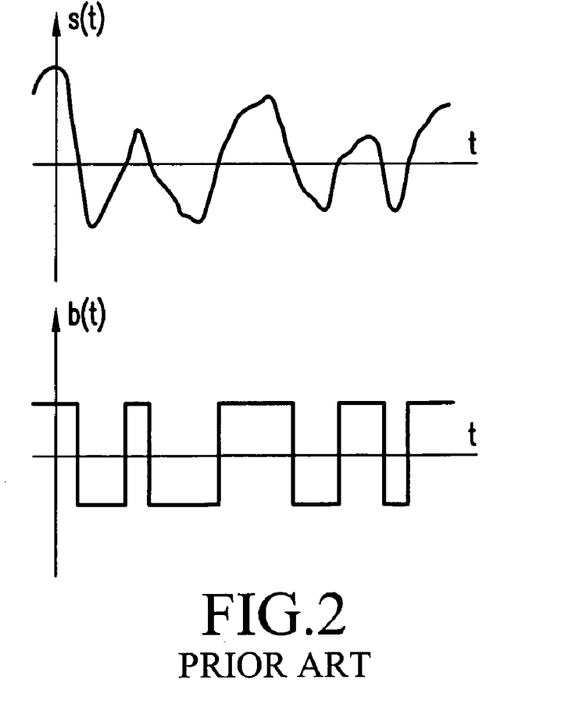
FIG. 2 shows a typical realisation of a noise signal s(t) and a random binary waveform b(t) obtained from that noise signal and defined by zero-level crossings of that signal.

One convenient and inexpensive method to generate a random binary waveform is based on level crossings of a random signal generated by a physical noise source. FIG. 1 shows an example of a generator of a random binary waveform. The generator comprises a physical noise source (PNS) and a zero-crossing detector (ZCD) which can be a comparator or a hard limiter. FIG. 2 shows a typical realisation of a noise signal s(t) and a random binary waveform b(t) obtained from that noise signal and defined by zero crossings of that signal. Each zero crossing results in an event (an edge) in the binary waveform b(t), the events occurring aperiodically and unpredictably.

Figure 3:
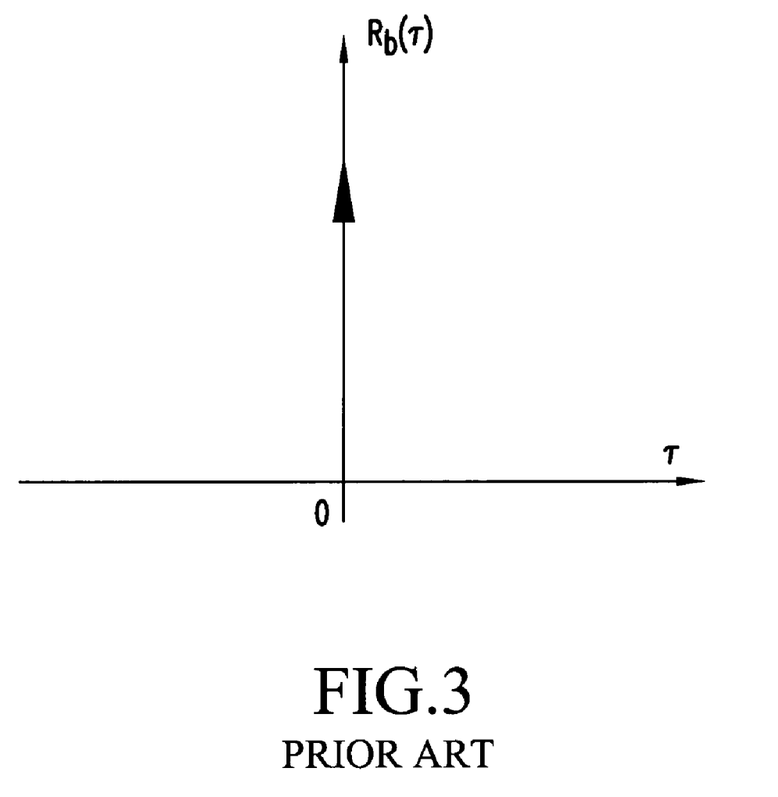
FIG. 3 shows the shape of the correlation function $R_b(\tau)$ of a random binary waveform b(t) ideal for ranging applications.

In radar and also other applications the shape of the correlation function of a binary waveform is of primary importance. The ideal correlation function would have the form of an impulse (Dirac delta) function. In practice, the correlation function of a 'good' binary waveform should attempt to approximate in some way this ideal shape. FIG. 3 shows the shape of the correlation function $R_b(\tau)$ of a random binary waveform b(t) ideal for ranging applications.

In practice it is relatively easy to generate noise signals with a Gaussian distribution, e.g., by exploiting thermal noise. When an underlying noise signal s(t) has a Gaussian distribution, the correlation function $R_b(\tau)$ of a binary waveform b(t) obtained from zero crossings of the signal s(t) can be determined from Van Vleck's formula $$R_b(\tau) = (2/\pi) \arcsin[R_s(\tau)]$$

where $R_s(\tau)$ is the correlation function of the underlying noise signal s(t). Therefore, in order to obtain a narrow correlation function $R_b(\tau)$ of a random binary waveform b(t), the correlation function $R_s(\tau)$ of an underlying noise signal s(t) should also be narrow. Because the correlation function and the power spectral density of a random signal form a Fourier pair, a physical noise source utilised to generate a binary waveform with a narrow correlation function should produce a noise signal with an extremely wide frequency spectrum.

It is known that the correlation function of a random binary waveform, not necessary obtained from a Gaussian noise signal has a cusp at the origin and that this cusp is sharper when the average number, $N_0$, of zero crossings in unit time is larger. When an underlying noise signal s(t) has a Gaussian distribution, the average number, $N_0$, of zero crossings in unit time can be determined from Rice's formula:

$$N_0 = B_s/\pi$$

where $B_s$ is the angular root-mean-square (rms) bandwidth (measured in radians per second) of signal s(t). Consequently, when a Gaussian noise signal s(t) is employed to generate a random binary waveform b(t), it is not possible to reduce the width of the correlation function $R_b(\tau)$ of the binary waveform by means other than the increase in the rms bandwidth $B_s$ of the underlying noise signal s(t). Unfortunately, the generation of ultra wideband noise signals is very difficult in practice.

SUMMARY OF THE INVENTION

It would, accordingly, be desirable to provide an apparatus and method for the generation of a random binary waveform with an extremely narrow correlation function suitable for ranging and other applications.

It would also be desirable to provide an apparatus and method for the generation of a random binary waveform intended for application in multi-user environments.

It would be further desirable to provide an apparatus and method for the generation of a random binary waveform resistant to deliberate intelligent jamming.

It would additionally be desirable to provide an apparatus and method for the generation of a random binary waveform with low probability of intercept.

According to one aspect of the invention there is provided a method of generating a resultant signal containing time marks, referred to herein as events, which occur at random intervals, the method comprising generating a plurality of preliminary signals each containing events occurring at random intervals and combining the preliminary signals. The combining is performed in such a way as to preserve, at least substantially, the events therein. In the embodiments described below, the combining is performed by multiplying (in either the analog or digital domain) and results in the interspersing of the events in the resultant signal. At least one of the preliminary signals contains events occurring asynchronously (i.e. without being clocked, and indeed the system of the present invention does not depend on the use of a clock).

Throughout the present specification, including the claims, except where the Context indicates otherwise, the term "random" is intended to cover not only purely random, non-deterministically generated signals, but also pseudo-random, deterministic signals such as the output of a shift register arrangement provided with a feedback circuit as used in the prior art to generate pseudo-random binary signals, and chaotic signals. Preferably, however, at least one of the preliminary signals is purely random (non-deterministic), or possibly chaotic, and contains aperiodic events.

According to a further aspect of the invention, a method of generating a random signal comprises producing a plurality of preliminary signals of random amplitude which can be level-detected to generate a binary waveform with transitions at random intervals, and combining the signals either before or after level-detection in order to generate a resultant random binary output. The combining of the signals is performed in such a manner that the events represented by the transitions are, at least partly, preserved. The preliminary signals are, at least partly, uncorrelated.

Some of the signals or binary waveforms to be combined can be obtained from a single signal or a single binary waveform by utilising a plurality of suitably time-delayed replicas of this signal or waveform. The time-delayed replicas should be, at least partly, uncorrelated with each other, and to this end the time delay used to form each replica preferably has a value which corresponds to a substantially zero level of the correlation function of the original signal.

In another embodiment, the plurality of preliminary signals are derived from a common physical noise source which produces an output of random amplitude. Each preliminary signal is derived by level-detection, at a respective, different level, of the output of the physical noise source. The levels are preferably separated sufficiently so as to avoid significant correlation between the preliminary signals.

BRIEF DESCRIPTION OF THE DRAWINGS

Arrangements embodying the invention will now be described by way of example with reference to the accompanying drawings, in which like reference symbols represent like integers, and in which.

DETAILED DESCRIPTION

Figure 4:
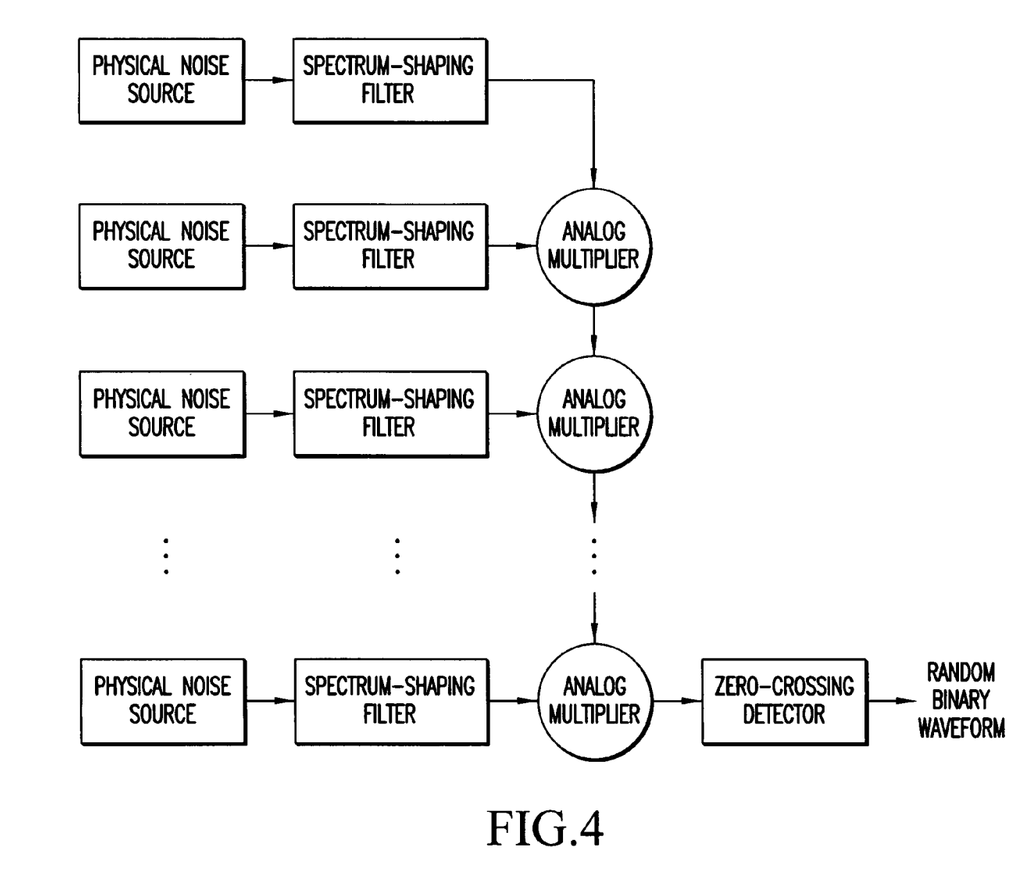
FIGS. 4 to 6 are block diagrams of, respectively, first to third embodiments of a system according to the present invention.

FIG. 4 shows a system according to the present invention that comprises a plurality of wideband physical noise sources (PNS) followed by spectrum-shaping filters (SSF), a plurality of analog multipliers (AM) or balanced modulators, and a single zero-crossing detector (ZCD) which can be a comparator or a hard limiter. A random binary waveform (RBM) useful for modulating a carrier prior to transmission in radar and communications applications is obtained at the output of the zero-crossing detector (ZCD).

Preferably the physical noise source (PNS) is a Zener diode used as per se known in the prior art, which provides an output having a Gaussian voltage distribution.

Preferably the zero-crossing detector (ZCD) is a fast comparator with a zero threshold.

In operation, each physical noise source (PNS) produces a waveform similar to that shown at s(t) in FIG. 2, the waveforms being uncorrelated. Each waveform is filtered by a respective spectrum-shaping filter (SSF) which may have an approximately Gaussian power transfer function $|H(\omega)|^2$ of the form:

$$|H(\omega)|^2 = \text{const} \exp(-\omega^2/2B_s^2)$$

where $B_s$ is the angular rms bandwidth.

The advantage of such a characteristic is that the Four transform exhibits a monotonic decline to zero level, and thus exhibits no undershoot or ringing. Other types of transfer functions, preferably exhibiting similar advantages, could alternatively be used. It is possible to use filters with identical characteristics for the respective channels (noise sources), or if desired different characteristics could be selected, or indeed in some circumstances the filters could be omitted.

The outputs of the first two filters are multiplied by the first of the analog multipliers (AM), the Output of which is multiplied by the output from the third filter (SSF) in the next analog multiplier (AM), etc. The output from the final analog multiplier (AM) is also a waveform generally similar to s(t) in FIG. 2 except that there is a substantially greater number of zero-crossings. In effect, the number of zero-crossings is the sum of the number in each of the respective signals from the noise sources (PNS). This output signal is delivered to the zero-crossing detector (ZCD) to produce the random binary waveform (RBM), similar to that shown at b(t) in FIG. 2 but again containing a substantially greater number of transitions.

As a result of this arrangement, assuming that there are n channels, the number of zero-crossings in unit time as compared with a single noise source is increased by a factor of n, thus producing a substantially sharper correlation function and therefore a signal which is much better suited to ranging applications, for example. The rms bandwidth, however, is increased by only $\sqrt{n}$.

Although increasing the number of channels also increases the sharpness of the correlation function, the extent of the improvement reduces with an increase in the number of channels. By way of example, assume that each spectrum-shaping filter has an approximately Gaussian power transfer function $|H(\omega)|^2$ of the form:

$$|H(\omega)|^2 = \text{const } \exp(-\omega^2/2B_s^2)$$

where $B_s$ is the angular rms bandwidth of the filter. The table below shows the reduction in the half-height width of the correlation function of a random binary waveform as a function of the number of combined channels.

| Number of identical channels combined | Half-height width of the correlation function (normalized units) |
|---|---|
| 1 | 1.00 |
| 2 | 0.56 |
| 3 | 0.39 |
| 4 | 0.30 |
| 5 | 0.25 |
| 6 | 0.21 |
| 7 | 0.18 |
| 8 | 0.16 |

In practical embodiments, it is likely that the optimum number of channels would be three or four, as the cost of increasing the number of channels is unlikely to justify the added improvement in the signal.

In the embodiments to be described below, similar considerations apply to the preferred nature of the physical noise sources (PNS), the spectrum-shaping filters (SSF) and the zero-crossing detector (ZCD), and to the number of channels.

Figure 5:
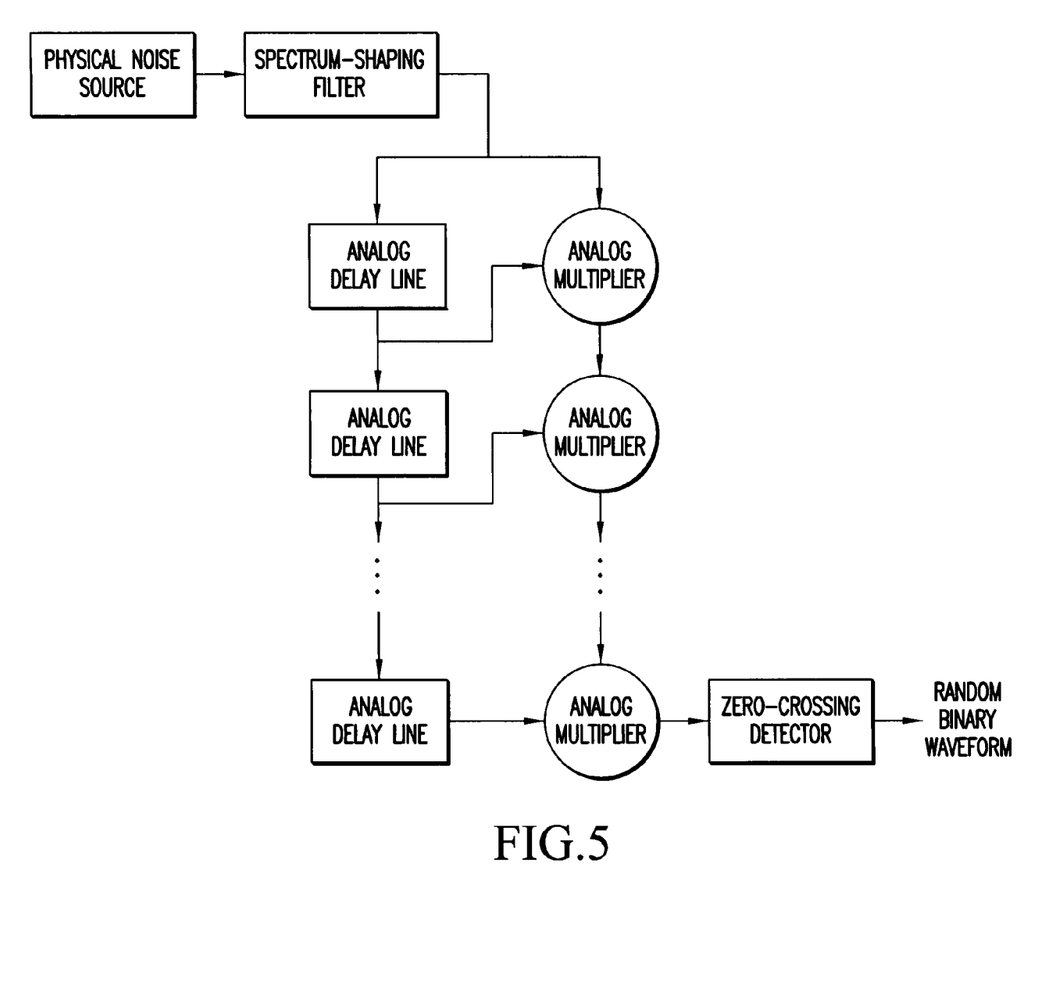

FIG. 5 shows another system according to the present invention that comprises a single wideband physical noise source (PNS) followed by a spectrum-shaping filter (SSF), a plurality of analog delay lines (DL), a plurality of analog multipliers (AM) or balanced modulators, and a single zero-crossing detector (ZCD) which can be a comparator or a hard limiter. A random binary waveform (RMB) is obtained at the output of the zero-crossing detector (ZCD).

FIG. 5 differs from the arrangement shown in FIG. 4 by virtue of the fact that, instead of using independent noise sources (PNS), a single noise source (PNS) is used, the remainder of the preliminary noise signals being produced by time-delayed replicas of the original noise signal, the delays being produced by the analog delay lines (DL). In order to ensure that the noise signals delivered to the analog multipliers (AM) are substantially uncorrelated, each delay line imparts a sufficiently long delay; the delay is such that the correlation function of the signal produced is substantially zero at that delay point. The delays may be different from each other, and/or may vary with rime.

Figure 6:
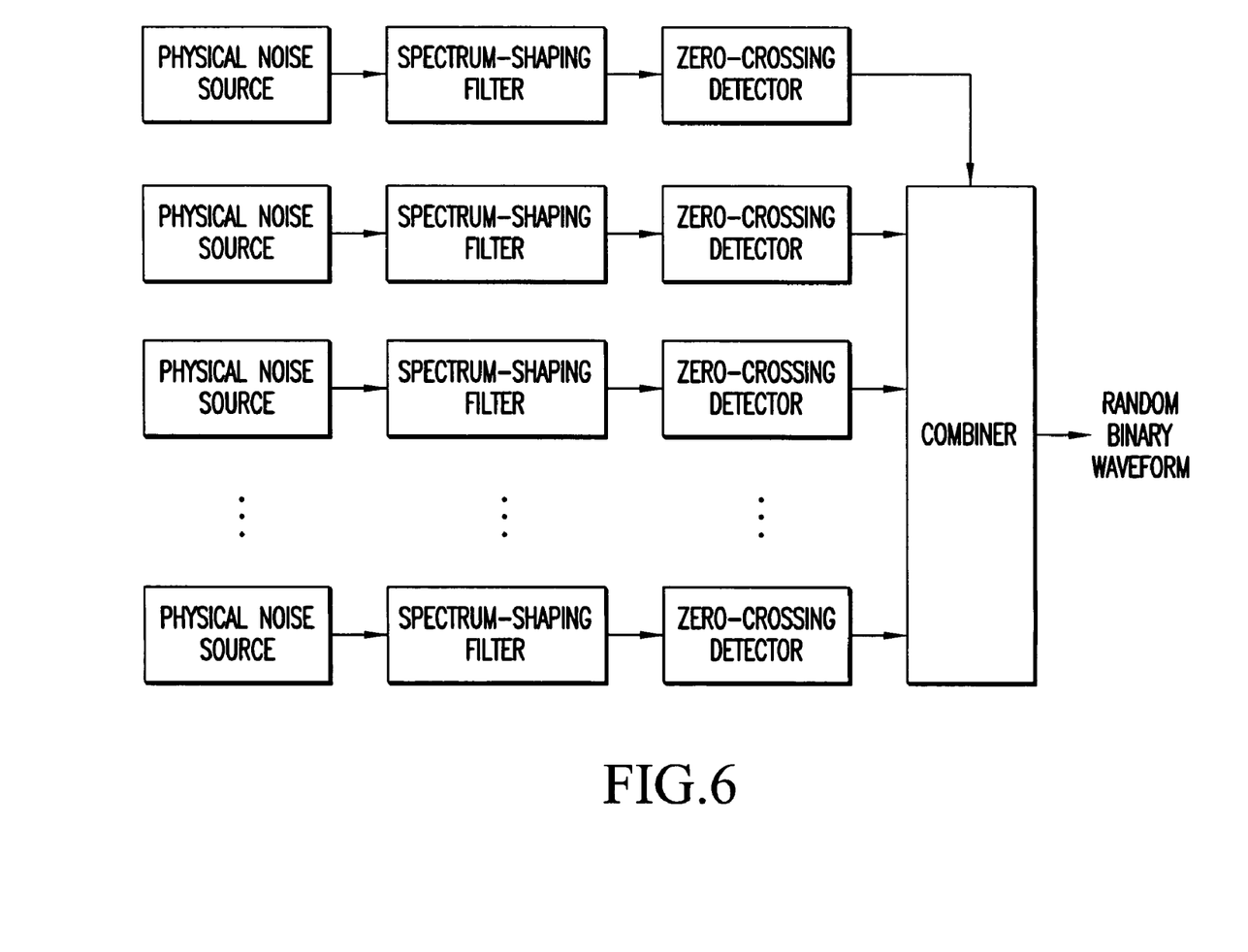

FIG. 6 shows yet another system according to the present invention that comprises a plurality of physical noise sources (PNS), each followed by a spectrum-shaping filter (SSF) and a zero-crossing detector (ZCD). The binary waveforms obtained at the outputs of the zero-crossing detectors (ZCD) are then fed to a suitable multi-input-single-output combiner (MIC) that processes those waveforms in such a manner that their respective zero crossings are, at least partly, preserved. A random binary waveform (RBM) is obtained at the output of the combiner (MIC).

FIG. 6 differs from the arrangement shown in FIG. 4 in that the noise signals are converted into binary signals, by the zero-crossing detectors (ZCD), before being combined.

Figure 7:
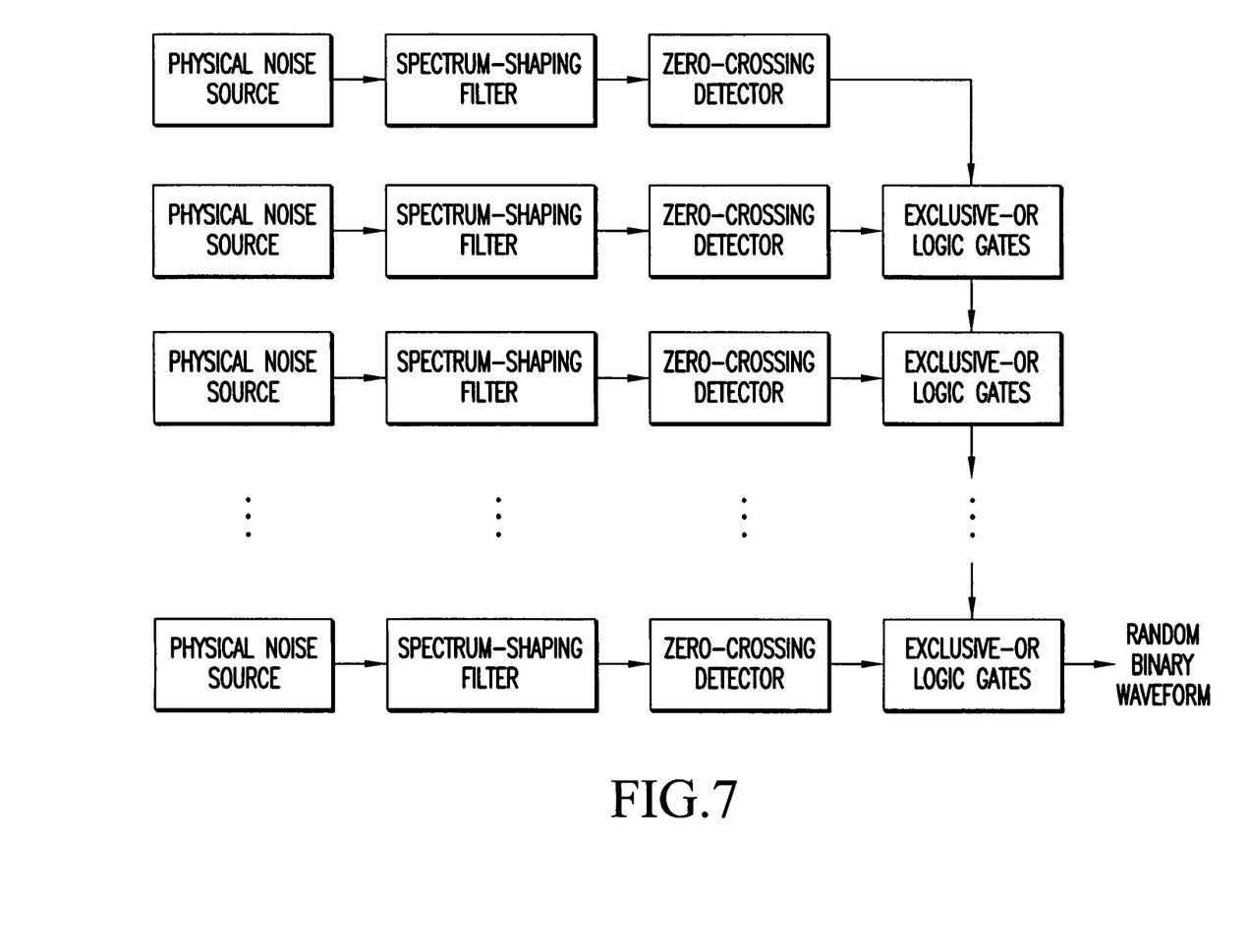
FIG. 7 is a block diagram of a specific example of the embodiment shown in FIG. 6.

FIG. 7 shows a specific example of the system of FIG. 6 where the combiner (MIC) is formed by a plurality of suitably connected Exclusive-OR logic gates (XOR). These gates, as is well known, perform a binary multiplying operation.

Figure 8:
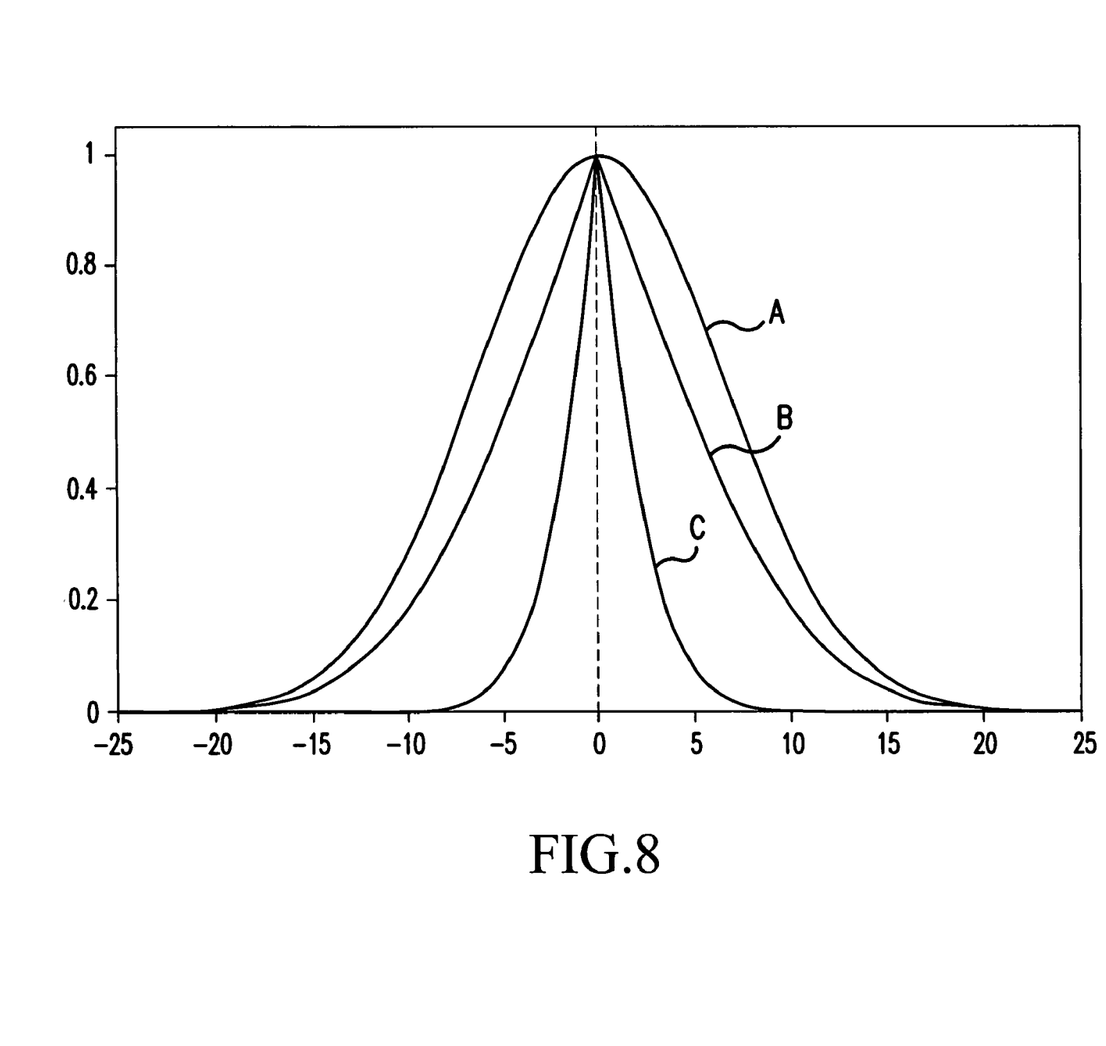
FIG. 8 shows the correlation function of a random binary waveform generated by the embodiment of FIG. 7.

FIG. 7 represents a preferred embodiment of the invention, assuming that the number of physical noise sources is equal to four. In one particular example of this embodiment, assume that the rms bandwidth measured in Hertz (i.e., $B_s/2\pi$) of the output of each noise source (PNS) is equal to 25 MHz. For the purpose of this analysis it is also assumed that zero-crossing detectors and Exclusive-OR gates have infinitely fast responses. The half-height width of the correlation function of a binary waveform obtained at the output of any of the zero-crossing detectors is equal to 10.6 ns. However, the half-height width of the correlation function of the resulting binary waveform obtained at the output of the system is equal to 3.2 ns FIG. 8 shows at A the auto-correlation function of the noise signal produced by a single physical noise source (PNS). B represents the correlation function of the binary waveform at the output of the zero-crossing detector (ZCD). C shows the auto-correlation function of the random binary waveform at the output of the embodiment of FIG. 7, obtained by combining four uncorrelated binary waveforms. It will be seen that the correlation function C is much sharper than either of the functions A and B.

Figure 9:
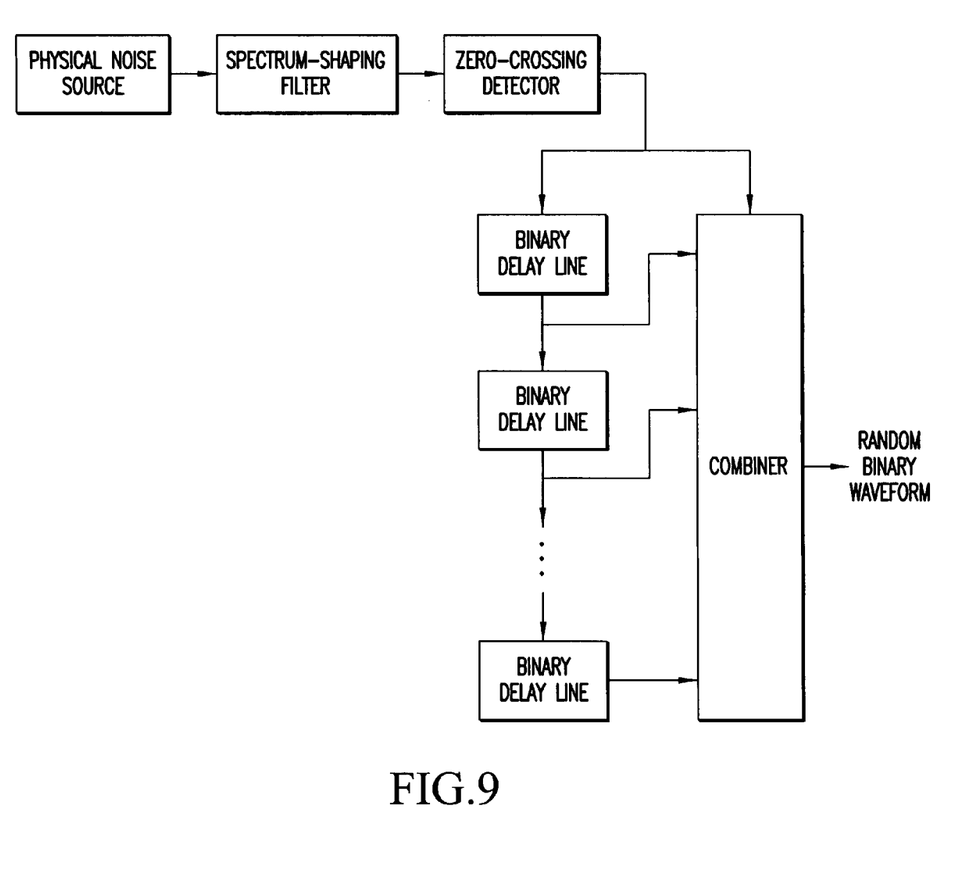
FIG. 9 is a block diagram of yet another embodiment of a system according to the present invention.

FIG. 9 shows yet another system according to the present invention that comprises a single physical noise source (PNS) followed by a spectrum-shaping tilter (SSF) and a zero-crossing detector (ZCD), a plurality of binary delay lines (BDL) and a suitable multi-input-single-output combiner (MIC) that processes the waveforms in such a manner that their respective zero crossings are, at least partly, preserved. A random binary waveform (RBM) is obtained at the output of a combiner (MIC).

This is thus similar to the embodiment of FIG. 6, except (analogously to FIG. 5) the separate noise sources are replaced by delay lines.

Figure 10:
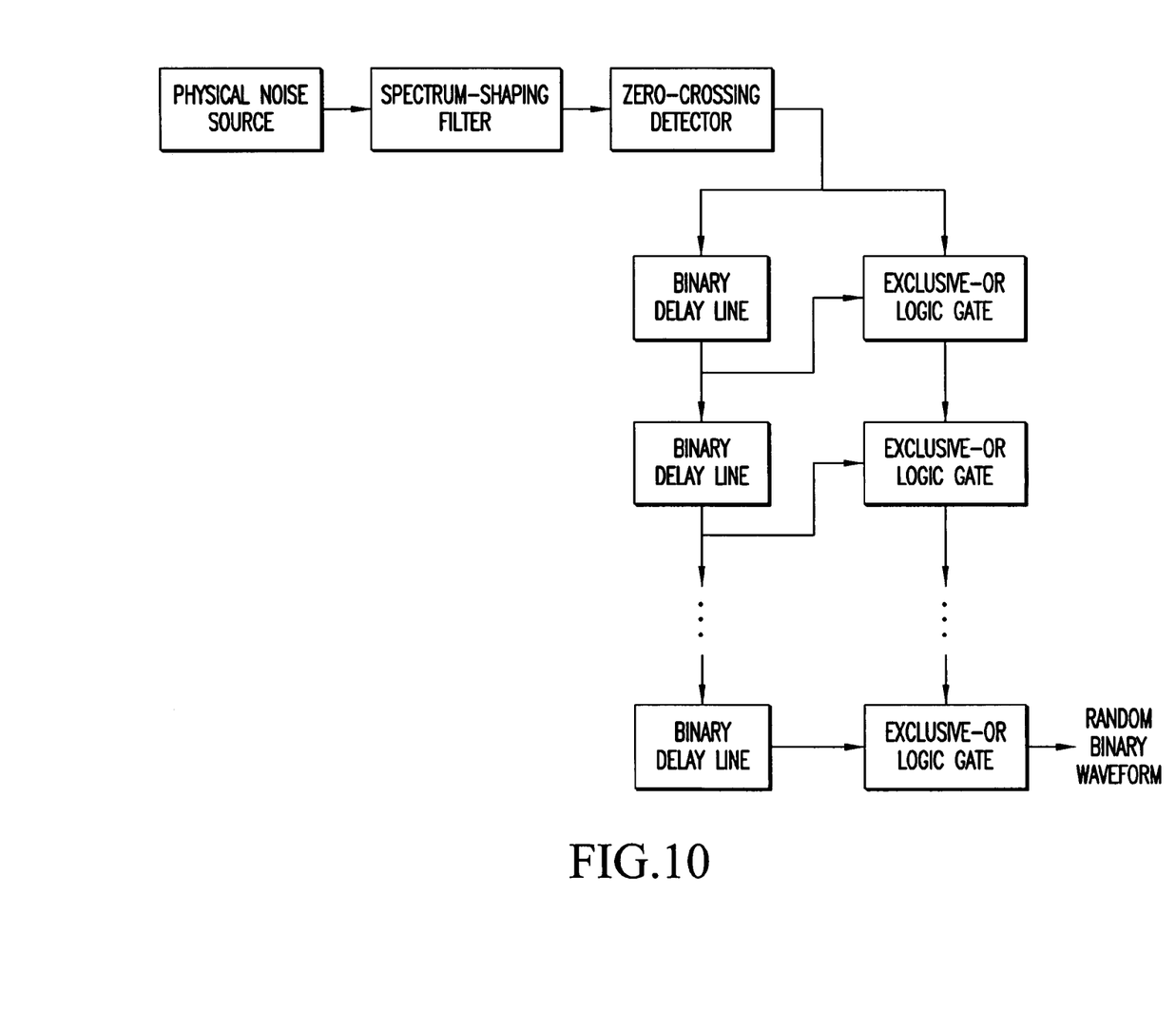
FIG. 10 is a block diagram of a specific example of the embodiment shown in FIG. 8.

FIG. 10 shows a specific example of the system shown in FIG. 9 where the combiner (MIC) is formed by a plurality of suitably connected Exclusive-OR logic gates (XOR).

Figure 11:
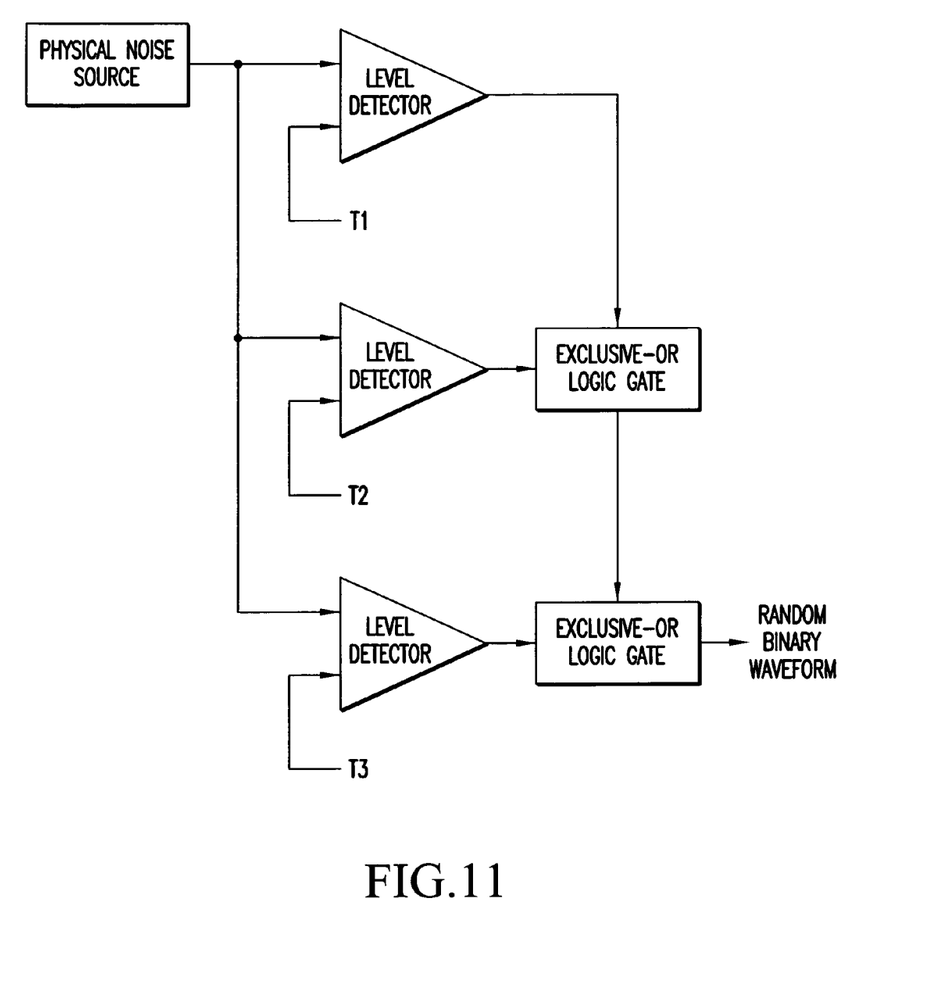
FIG. 11 is a block diagram of another embodiment of the present invention.

FIG. 11 shows another embodiment of the present invention, in which the output of a physical noise source (PNS) is applied to three level detectors (LD), each of which is arranged to change the state of its output when the signal from the noise source crosses a respective threshold level T1, T2 or T3. The outputs of the level detectors (LD) are combined by Exclusive-OR (XOR) circuits, as in the embodiment of FIG. 10, to produce the resultant random binary waveform (RBM). The threshold levels T1, T2 and T3 are separated sufficiently to avoid significant correlation between the outputs of the level detectors (LD). Of course, instead of having level detectors which operate using different threshold levels, it would be possible to use level detectors with a common threshold level, such as zero-crossing detectors, if varying amounts of DC shift are applied to the output of the physical noise source before the respective level detection operations.

Some of the physical noise sources (PNS) referred to above may be replaced by other physical sources utilised to generate chaotic signals, and some, but not all, by other deterministic pseudo-random sources.

Figure 12:
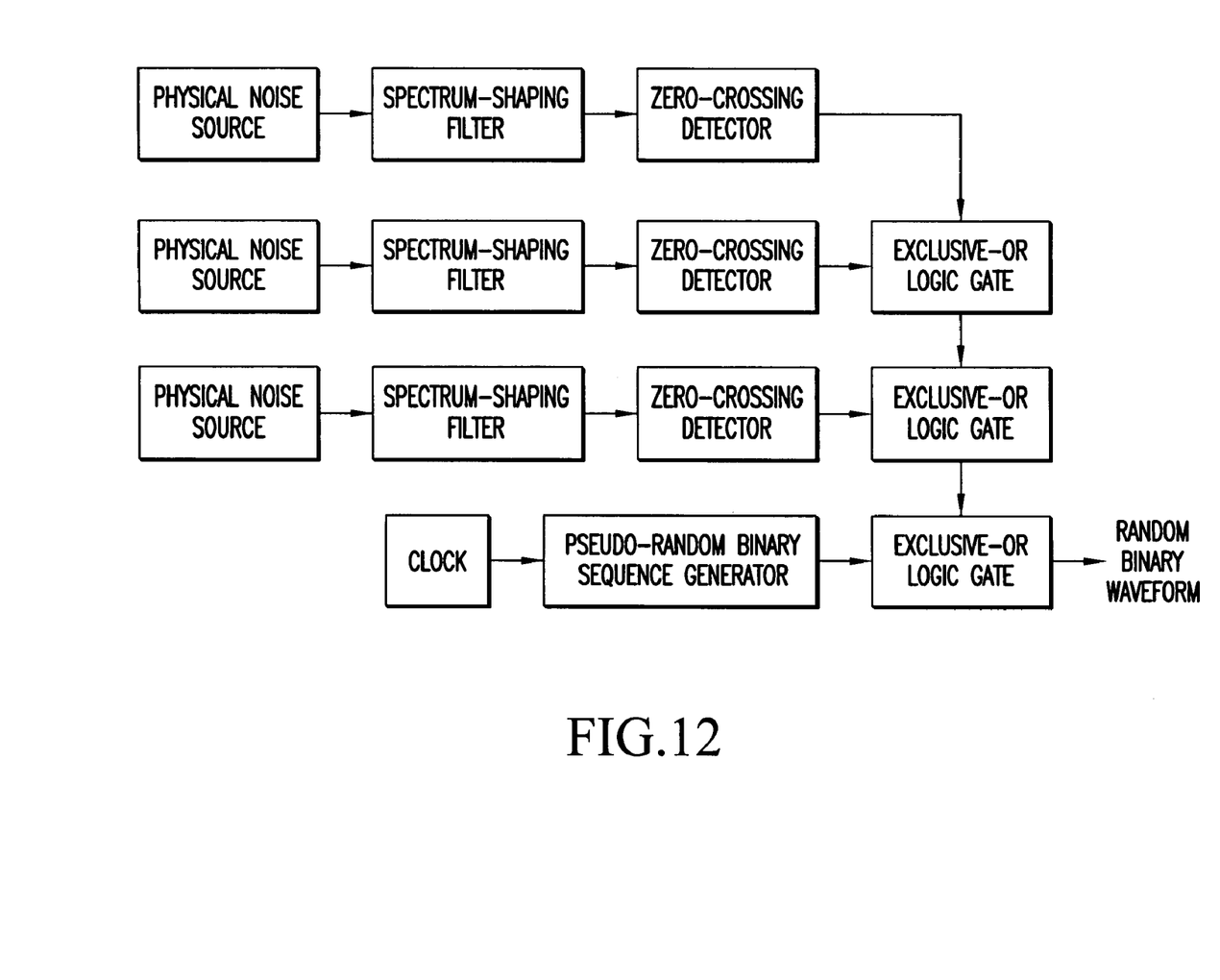
FIG. 12 is a block diagram of a further embodiment of the present invention.

FIG. 12 is a functional block diagram of another random binary waveform generator representing another preferred embodiment of the present invention. The system consists of four channels; each of three identical channels comprises a wideband physical noise source (PNS), a spectrum-shaping filter (SSF) and a zero-crossing detector (ZCD).

The fourth channel comprises a pseudo-random binary sequence generator (PRBS) driven by a clock unit (CLK) whose frequency may be constant or may vary. Preferably the pseudo-random binary sequence generator (PRBS) is a shift register with a feedback circuit constructed in accordance with the prior art. A random binary waveform is obtained at the output of the last gate (XOR) of the cascade. Although the correlation function of a pseudo-random binary sequence is periodic, the correlation function of the resulting random binary waveform is aperiodic.

In one example of the arrangement of FIG. 12, assume that the rms bandwidth measured in Hertz (i.e., $B_s/2\pi$) is equal to 15 MHz. For the purpose of this analysis it is assumed that zero-crossing detectors and Exclusive-OR gates have infinitely fast responses. It is also assumed that the pseudo-random binary sequence generator (PRBS) is driven by a clock with frequency of 66 MHz. The pseudo-random binary sequence generator (PRBS) consists of seven stages with a suitable feedback to obtain a sequence of length 127. The half-height width or the correlation function of a binary waveform obtained at the output of any of the zero-crossing detectors is equal to 17.6 ns. However, the half-height width of the correlation function of the resulting binary waveform obtained at the output of the system is equal to 5.2 ns.

Figure 13:
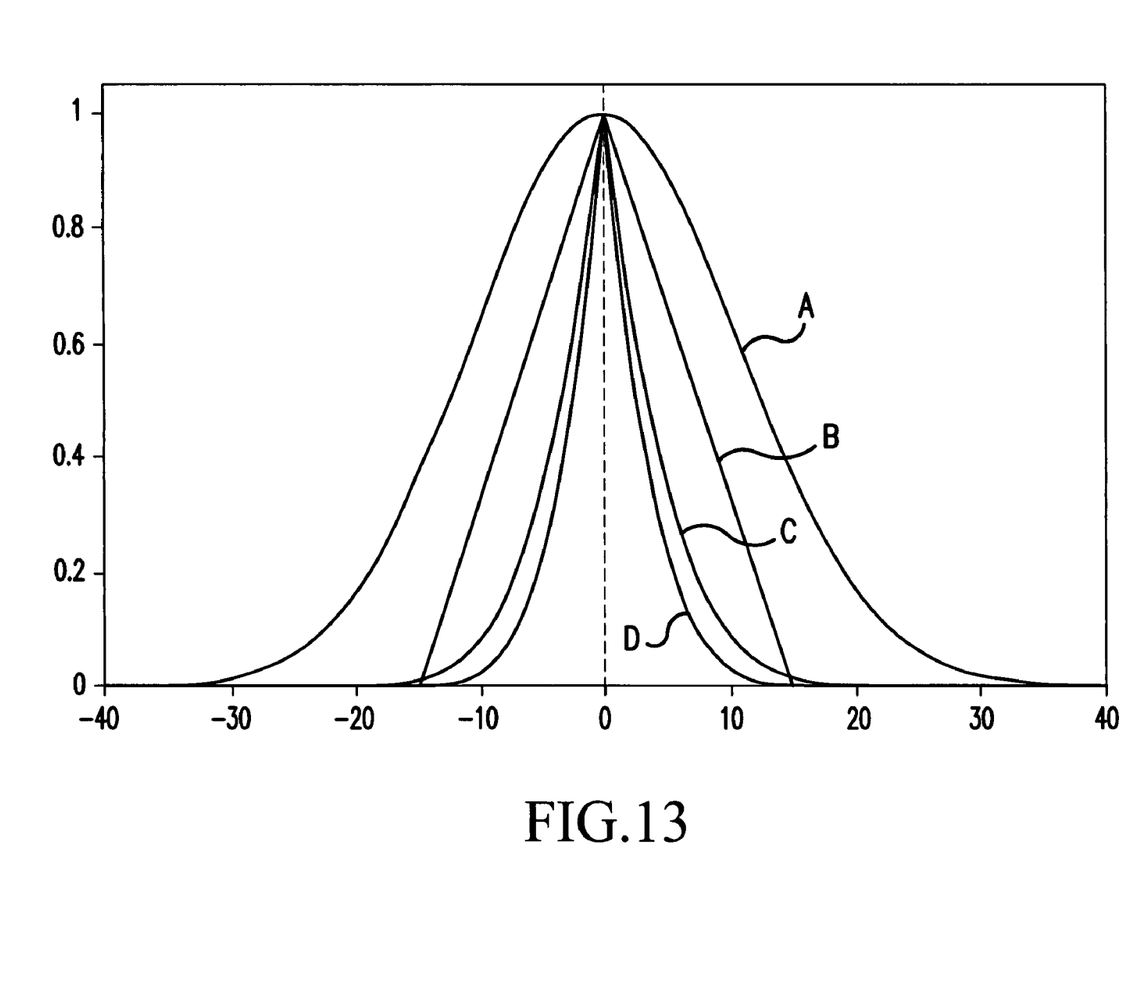
FIG. 13 shows the correlation function of a random binary waveform generated by the embodiment of FIG. 11.

FIG. 13 shows at A the auto-correlation function of the output signal produced by a physical noise source (PNS) of the embodiment of FIG. 12. B represents the correlation function for the pseudo-random binary sequence (PRBS). C is the correlation function for the binary waveform obtained by combining the three uncorrelated binary waveforms derived from the physical noise sources (PNS). D is the correlation function for the output of the FIG. 12 embodiment, which is produced by combining the three uncorrelated binary waveforms from the physical noise sources with the output of the pseudo-random binary sequence (PRBS).

The correlation function for the output of a physical noise source (PNS) exhibits tails which extend to plus and minus infinity. This also applies to the binary waveform derived therefrom, and to the combination of the binary waveforms derived from the physical noise sources (PNS). However, the correlation function for the pseudo-random binary sequence (PRBS) exhibits defined upper and lower temporal limits (within the range shown in FIG. 13). This therefore also applies to the correlation function D for the output of the FIG. 12 embodiment, because this combines the binary waveforms derived from the physical noise sources (PNS) with the pseudo-random binary sequence (PRBS) by Exclusive-OR'ing. This can have significant benefits, for example when the random binary waveform (RBM) is used for modulating carrier signals in radar or similar applications, because placing limits on the range of the auto-correlation function aids in the design of the system.

The invention thus provides a way of obtaining a random binary waveform with a sharp correlation function. This is achieved in the preferred embodiments by generating Gaussian signals and combining them in a non-linear manner in order obtain a non-Gaussian signal which is used to produce the random binary waveform. Various modifications are possible. The various features disclosed in respect of specific embodiments, particularly the techniques used for producing the preliminary signals which are then combined, can also be used in the other embodiments.

A random binary waveform generator in accordance with the present invention is particularly suited for use in a time delay determination system according to International Patent Application No. WO 00/39643, filed 24 Dec. 1999, the contents of which are incorporated herein by reference.

The invention claimed is:

1. A method of generating a random binary waveform containing events which occur at random intervals, the method comprising:
    deriving, from a physical noise source, a first preliminary signal containing first events occurring asynchronously and at random intervals; and
    multiplying the first preliminary signal with at least one further preliminary signal containing further events, said at least one further preliminary signal being a deterministic signal, so as to intersperse the first and further events;
    wherein the physical noise source produces a non-deterministic output.

2. A method as claimed in claim 1, wherein the preliminary signals are combined by analogue multiplication.

3. A method as claimed in claim 1, wherein the preliminary signals are binary signals which are combined by binary multiplication.

4. A method as claimed in claim 3, wherein the preliminary signals are combined by an Exclusive-OR operation.

5. A method as claimed in claim 1, wherein said at least one further preliminary signal is a pseudo-random binary sequence.

6. A method as claimed in claim 1, wherein said at least one further preliminary signal is a chaotic signal.

7. A method as claimed in claim 1, including producing a signal form said physical noise source and applying a spectral filter to the signal in order to obtain said first preliminary signal.

8. A method as claimed in claim 1, wherein the number of preliminary signals, including said first and further preliminary signals, is equal to 3 or 4.

9. A method of detecting objects comprising measuring the delay between transmission of a signal modulated by a random binary waveform generated by a method according to claim 1 and receipt of the reflection of the signal from the object.

10. Apparatus for generating a random binary waveform containing events which occur at random intervals, the apparatus comprising:
    a physical noise source producing a random output signal;
    means for deriving, from said random output signal, a first preliminary signal containing first events occurring asynchronously at random intervals;
    means for providing at least one further preliminary signal containing further events occurring at said random intervals, said further preliminary signal being a deterministic signal; and
    means for multiplying the first preliminary signal and said at least one further preliminary signal so as to produce a random binary waveform in which said first and further events are interspersed;
    wherein the physical noise source produces a non-deterministic output.

11. An apparatus as claimed in claim 10, wherein said at least one further preliminary signal is a pseudo-random binary sequence.

* * * * *